United States Patent
Lee et al.

(10) Patent No.: US 10,482,937 B2
(45) Date of Patent: Nov. 19, 2019

(54) MEMORY DEVICES AND MEMORY SYSTEMS INCLUDING THE SAME

(71) Applicant: Samsung Electronics Co., Ltd., Suwon-si, Gyeonggi-do (KR)

(72) Inventors: Jang Woo Lee, Seoul (KR); Jeong Don Ihm, Seongnam-si (KR); Byung Hoon Jeong, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/033,691

(22) Filed: Jul. 12, 2018

(65) Prior Publication Data

US 2019/0214064 A1 Jul. 11, 2019

(30) Foreign Application Priority Data

Jan. 10, 2018 (KR) .................. 10-2018-0003474

(51) Int. Cl.
*G11C 7/00* (2006.01)
*G11C 7/22* (2006.01)

(52) U.S. Cl.
CPC .............. *G11C 7/225* (2013.01); *G11C 7/227* (2013.01)

(58) Field of Classification Search
CPC ....... G11C 7/22; G11C 7/1066; G11C 7/1051; G11C 7/1078; G11C 11/4076

USPC .................................................. 365/193, 194
See application file for complete search history.

(56) References Cited

U.S. PATENT DOCUMENTS

| | | | |
|---|---|---|---|
| 6,292,521 B1 | 9/2001 | Lai et al. | |
| 7,457,913 B2 | 11/2008 | Dietrich et al. | |
| 7,804,727 B2 | 9/2010 | Kim | |
| 8,504,955 B2 | 8/2013 | Kawai | |
| 9,159,388 B2 | 10/2015 | Best et al. | |
| 9,536,579 B2 | 1/2017 | Iijima et al. | |
| 9,658,642 B2 | 5/2017 | Mozak | |
| 2007/0206428 A1* | 9/2007 | Bae et al. ............ | G11C 7/1051 365/193 |
| 2015/0063008 A1* | 3/2015 | Moon .................. | G11C 7/1087 365/154 |
| 2017/0110163 A1 | 4/2017 | Canac et al. | |

* cited by examiner

*Primary Examiner* — Son T Dinh
(74) *Attorney, Agent, or Firm* — Harness, Dickey & Pierce, P.L.C.

(57) ABSTRACT

A memory device that includes an interface that receives a data signal and a strobe signal from an external device, the strobe signal corresponding to the data signal; a strobe buffer that receives the strobe signal from the interface; a phase detection unit that detects a phase difference between the data signal output from the interface and the strobe signal output from the strobe buffer; a phase adjust unit that adjusts a phase of the strobe signal output from the strobe buffer based on the phase difference; and a sampling unit that samples the data signal output from the interface based on the strobe signal output from the phase adjust unit.

20 Claims, 8 Drawing Sheets

MEMORY DEVICES AND MEMORY SYSTEMS INCLUDING THE SAME

CROSS-REFERENCE TO RELATED APPLICATION

This application claims benefit of priority to Korean Patent Application No. 10-2018-0003474 filed on Jan. 10, 2018 in the Korean Intellectual Property Office, the disclosure of which is incorporated herein by reference in its entirety.

BACKGROUND

1. Field

Some example embodiments relate to memory devices and memory systems including the same.

2. Description of Related Art

In order to transmit and receive data between semiconductor chips at high speed, strobe signals are used to allow the data to be correctly recognized. Therefore, when data is transmitted and received between semiconductor chips at high speed, strobe signals are transmitted and received together with the data.

As a typical example, semiconductor memory devices, such as Synchronous Dynamic Random Access Memories (SDRAMs), may transmit and receive strobe signals with data signals to and from memory controllers or chipsets.

SUMMARY

Some example embodiments provide memory devices that precisely align a data signal and a strobe signal, even in the case in which the data signal is directly provided to a sampling circuit.

According to some example embodiments, a memory device is provided that includes an interface configured to receive a data signal and a strobe signal from an external device, the strobe signal corresponding to the data signal. The memory device also includes a strobe buffer configured to receive the strobe signal from the interface. The memory device also includes a phase detection unit configured to detect a phase difference between the data signal output from the interface and the strobe signal output from the strobe buffer. The memory device also includes a phase adjust unit configured to adjust a phase of the strobe signal output from the strobe buffer based on the phase difference. The memory device also includes a sampling unit configured to sample the data signal output from the interface based on the strobe signal output from the phase adjust unit.

According to some example embodiments, a memory system is provided including a memory controller configured to output a data signal including a plurality of pieces of data, the plurality of pieces of data including at least one piece of dummy data preceding a plurality of pieces of effective data, and a strobe signal including a plurality of timing pulses. The memory system also includes a memory device including a strobe buffer configured to receive the strobe signal, a phase detection unit configured to detect a phase difference between the data signal and the strobe signal output from the strobe buffer based on the at least one piece of dummy data and the strobe signal, a phase adjust unit configured to adjust a phase of the strobe signal output from the strobe buffer according to the phase difference, and a sampling unit configured to sample the data signal according to the strobe signal output from the phase adjust unit.

According to some example embodiments, a memory system is provided including a memory controller configured to output a plurality of data signals and a strobe signal corresponding to the plurality of data signals, each of the plurality of data signals including effective data, the effective data being delayed for a determined duration with respect to the strobe signal. The memory system also includes a memory device configured to receive the strobe signal via a strobe buffer, replicate the strobe signal to generate a plurality of strobe signals, a quantity of strobe signals in the plurality of strobe signals corresponding to a quantity of data signals in the plurality of data signals, adjust a phase of each of the plurality of strobe signals based on the plurality of data signals and the plurality of strobe signals, and sample the plurality of data signals according to respective strobe signals of the plurality of strobe signals.

BRIEF DESCRIPTION OF DRAWINGS

The above and other aspects, features, and advantages of the some example embodiments will be more clearly understood from the following detailed description, taken in conjunction with the accompanying drawings, in which.

DETAILED DESCRIPTION

Hereinafter, some example embodiments will be described with reference to the accompanying drawings.

Figure 1:
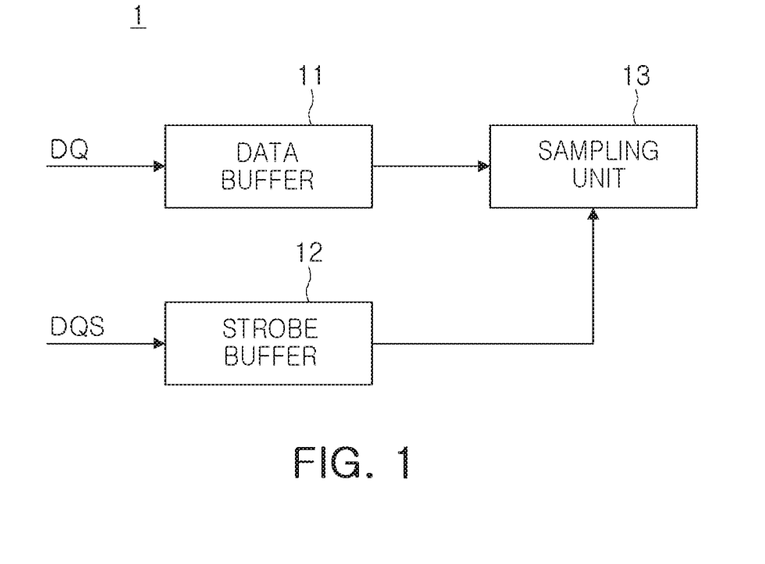
FIG. 1 is an example of a block diagram of a coupled memory device.

FIG. 1 is an example of a block diagram of a memory device. FIG. 1 illustrates a coupled memory device.

With reference to FIG. 1, a memory device 1 may include a data buffer 11, a strobe buffer 12, and a sampling unit 13. According to some example embodiments, operations described as being performed by any or all of the data buffer 11, the strobe buffer 12 and the sampling unit 13 may be performed by circuitry. For example, the circuitry may include an application-specific integrated circuit (ASIC) or a field programmable gate array (FPGA).

The memory device 1 may receive a data signal DQ and a strobe signal DQS from a memory controller. In some example embodiments, the data signal DQ and the strobe signal DQS may be input by the memory controller to have a phase difference of 90°. In other words, both a rising edge and a falling edge of the strobe signal DQS may be aligned with central portions of data in the data signal DQ input. According to some example embodiments, the memory controller may execute non-transitory computer-readable instructions stored in a memory to perform operations described herein as being performed by the memory controller.

The data signal DQ and the strobe signal DQS may be input to the data buffer 11 and the strobe buffer 12, respectively. Each of the data buffer 11 and the strobe buffer 12 may be implemented as an amplifier sequentially amplifying the data signal DQ and the strobe signal DQS, in order to reduce or prevent signal loss.

An amplifier of the strobe buffer 12 may be paired with an amplifier of the data buffer 11, so that the data signal DQ input to the data buffer 11 and the strobe signal DQS input to the strobe buffer 12 maintain the phase difference therebetween, while being transmitted to the sampling unit 13. The sampling unit 13 may be operated as a type of a latch circuit.

The sampling unit 13 may latch the data signal DQ using the strobe signal DQS aligned with the central portions of data in the data signal DQ, so that the memory device may correctly recognize the data signal DQ.

The description provided above illustrates that the data signal DQ and the strobe signal DQS, provided by the memory controller, have a phase difference of 90°. In other words, both the rising edge and the falling edge of the strobe signal DQS may be aligned with central portions of data in the data signal DQ as input. However, according to some example embodiments, the data signal DQ and the strobe signal DQS may be aligned to have a similar phase or the same phase. In other words, the rising edge and the falling edge of the strobe signal DQS may be aligned with respective edge portions of the data signal DQ and input.

In this case, in order to accurately recognize the data signal DQ, a shift circuit shifting a phase of the strobe signal DQS may be provided on a path of the strobe signal DQS.

Figure 2:
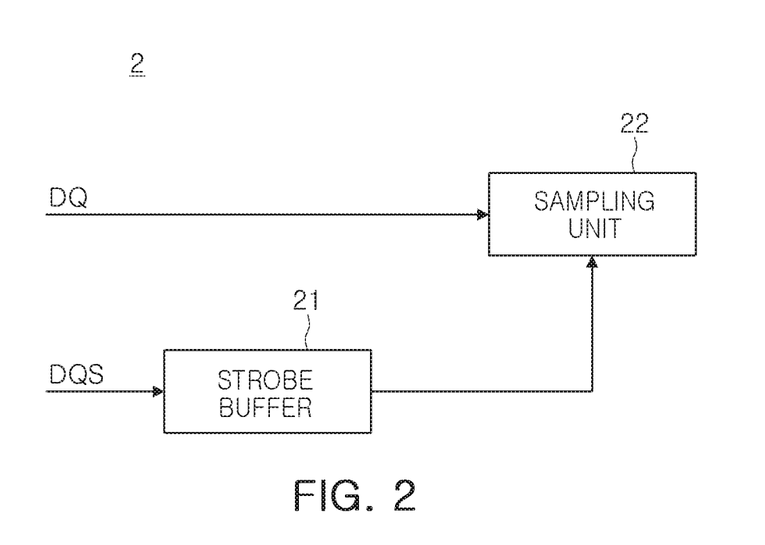
FIG. 2 is another block diagram of an uncoupled memory device.

FIG. 2 is another block diagram of a memory device. FIG. 2 illustrates an uncoupled memory device.

With reference to FIG. 2, a memory device 2 may include a strobe buffer 21 and a sampling unit 22. The strobe buffer 21 and the sampling unit 22 may be similar to or the same as the strobe buffer 12 and the sampling unit 13 of FIG. 1. Redundant descriptions between FIGS. 1 and 2 may be omitted.

The memory device 2 may receive a data signal DQ and a strobe signal DQS from a memory controller. The data signal DQ is directly provided to the sampling unit 22 to be directly sampled by the sampling unit 22, while the strobe signal DQS is provided to the sampling unit 22 through the strobe buffer 21.

In a manner different from the strobe buffer 12 of a coupled memory device of FIG. 1, in the case of the strobe buffer 21 of the uncoupled memory device of FIG. 2, the desire for matching may be removed reducing the difficulty of providing a gain from amplification and swing. Therefore, an uncoupled memory device 2 may improve bandwidth and voltage sensitivity, as compared to a coupled memory device 1. However, compensating for a delay of the strobe signal DQS caused by the strobe buffer 21, not compensated for in the uncoupled memory device 2, would be desirable.

Figure 3:
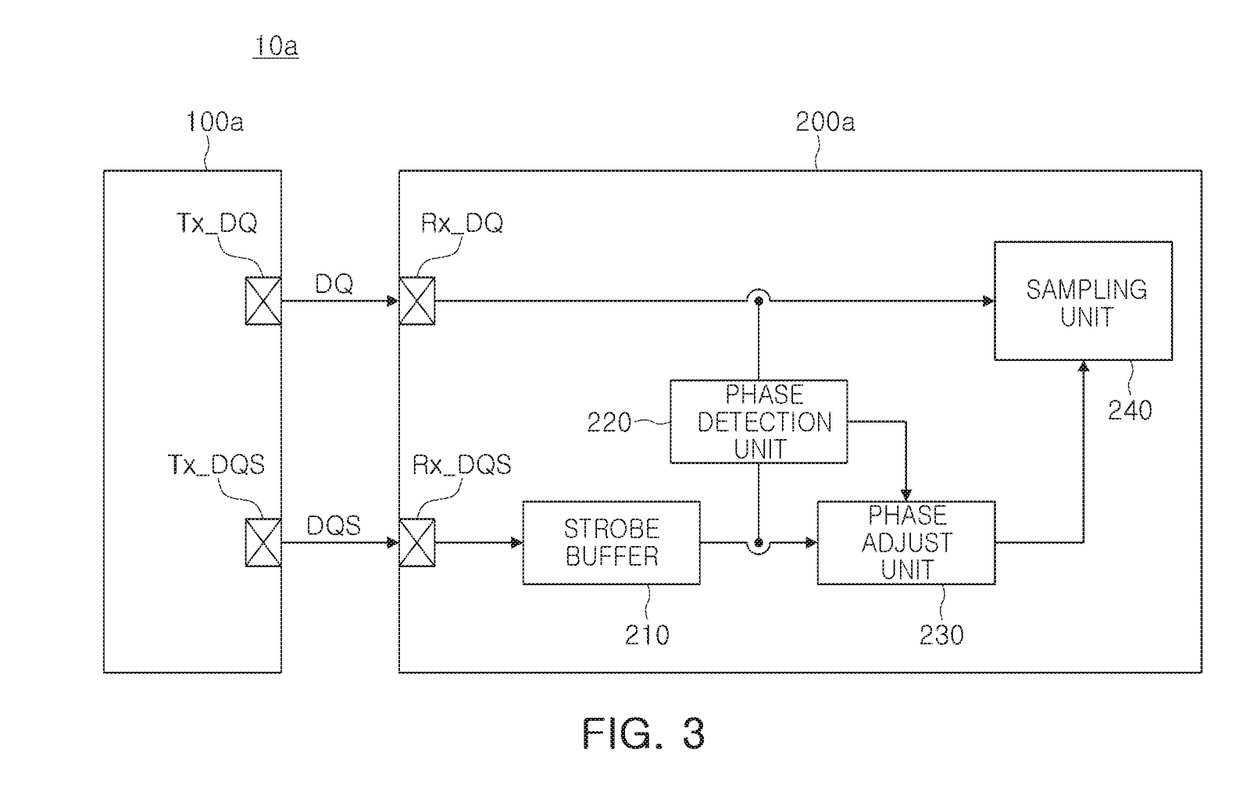
FIG. 3 is a block diagram of a memory system according to some example embodiments.

FIG. 3 is a block diagram of a memory system according to some example embodiments.

With reference to FIG. 3, a memory system 10*a* may include a memory controller 100*a* and a memory device 200*a*.

The memory controller 100*a* may output the data signal DQ and the strobe signal DQS through output pins Tx_DQ and Tx_DQS. The memory device 200*a* may receive the data signal DQ and the strobe signal DQS through input pins RX_DQ and RX_DQS (also referred to as an interface). According to some example embodiments, the memory controller 100*a* may execute non-transitory computer-readable instructions stored in a memory to perform operations described herein as being performed by the memory controller 100*a*.

The memory device 200*a* may include a strobe buffer 210, a phase detection unit 220, a phase adjust unit 230, and a sampling unit 240. According to some example embodiments, operations described as being performed by any or all of the strobe buffer 210, the phase detection unit 220, the phase adjust unit 230 and the sampling unit 240 may be performed by circuitry. For example, the circuitry may include an application-specific integrated circuit (ASIC) or a field programmable gate array (FPGA). The strobe buffer 210 and the sampling unit 240 may be similar to or the same as the strobe buffer 12 and the sampling unit 13 of FIG. 1. Redundant descriptions between FIGS. 1 and 3 may be omitted.

The strobe buffer 210 may receive the strobe signal DQS from the memory controller 100*a* to provide an input strobe signal DQS to the sampling unit 240 through the phase adjust unit 230. In addition, the sampling unit 240 may directly receive the data signal DQ from the memory controller 100*a*.

In order to correctly latch the data signal DQ in the sampling unit 240, the strobe signal DQS is aligned with a central portion of data in the data signal DQ, that is, a phase difference between the data signal DQ and the strobe signal DQS is 90°. However, the sampling unit 240 may directly receive the data signal DQ from the memory controller 100*a* and may receive the strobe signal DQS provided by the memory controller 100*a* through the strobe buffer 210. Thus, due to a delay of the strobe signal DQS caused by the strobe buffer 210, the phase difference between the data signal DQ and the strobe signal DQS may not be 90°.

The memory system according to some example embodiments may employ the phase detection unit 220 and the phase adjust unit 230 to compensate for a delay of the data signal DQ and the strobe signal DQS.

The phase detection unit 220 may detect the phase difference between the data signal DQ provided by the memory controller 100*a* and the strobe signal DQS provided by the strobe buffer 210. The phase difference therebetween may include a delay phase difference caused by the strobe buffer 210 disposed on a path of the strobe signal DQS and a phase difference between the data signal DQ and the strobe signal DQS as provided by the memory controller 100*a* (also referred to as an initial phase difference).

The phase detection unit 220 may detect the phase difference between the data signal DQ provided by the memory controller 100*a* and the strobe signal DQS provided by the strobe buffer 210, thereby determining a compensation level of the strobe signal DQS. In some example embodiments, the phase detection unit 220 may detect the phase difference by comparing a first datum of the data signal DQ with a first clock of the strobe signal DQS and may determine the compensation level according to a detected phase difference. The phase detection unit 220 may generate a compensation signal according to the compensation level of the strobe signal DQS, to be provided to the phase adjust unit 230.

The phase adjust unit 230 may receive the strobe signal DQS from the strobe buffer 210 and receive the compensation signal from the phase detection unit 220. The phase adjust unit 230 may adjust a phase of the strobe signal DQS provided by the strobe buffer 210 according to the compensation signal provided by the phase detection unit 220. In some example embodiments, the phase adjust unit 230 may adjust the phase of the strobe signal DQS so as to align a central portion of first effective data of the data signal DQ with a rising edge of the first clock of the strobe signal DQS. In other words, both a rising edge and a falling edge of the strobe signal DQS may be aligned with central portions of data in the data signal DQ by the phase adjust unit 230. The phase adjust unit 230 may provide the strobe signal DQS, a phase of which has been adjusted, to the sampling unit 240. In some example embodiments, the phase adjust unit 230 may include a delay locked loop circuit to adjust the phase of the strobe signal DQS in such a manner that the strobe signal DQS is delayed.

The sampling unit 240 may directly receive the data signal DQ from the memory controller 100a and receive the strobe signal DQS, a phase of which has been adjusted, from the phase adjust unit 230. The sampling unit 240 may recognize an appropriate data signal DQ in such a manner that the data signal DQ is latched using the strobe signal DQS aligned with the central portion of the data signal DQ after a phase of the strobe signal DQS is adjusted.

Figure 4:
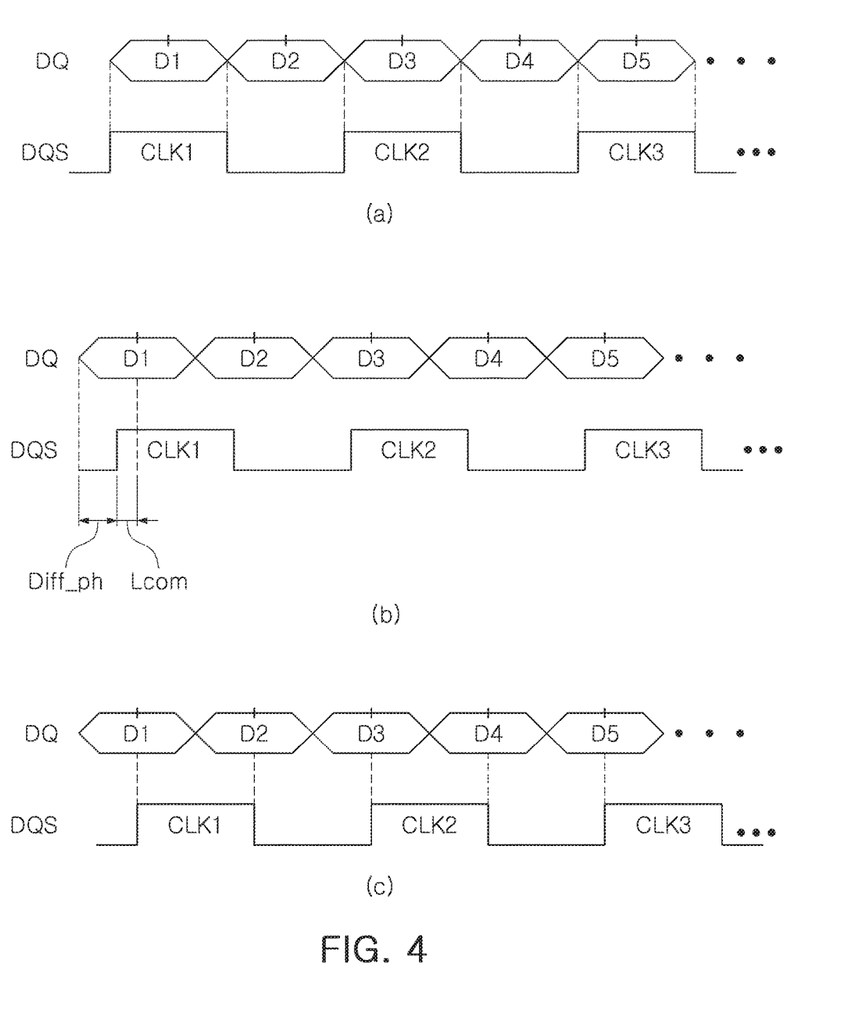
FIG. 4 is a waveform diagram illustrating a process of aligning a data signal and a strobe signal according to some example embodiments.

FIG. 4 is a waveform diagram illustrating a process of aligning a data signal and a strobe signal according to some example embodiments.

(a) of FIG. 4 illustrates a data signal DQ and a strobe signal DQS, provided by a memory controller 100a; (b) of FIG. 4 illustrates the data signal DQ and the strobe signal DQS, detected by a phase detection unit 220; and (c) of FIG. 4 illustrates the data signal DQ and the strobe signal DQS, provided to a sampling unit 240.

With reference to (a) of FIG. 4, the data signal DQ and the strobe signal DQS, provided by the memory controller 100a may be aligned to have a similar phase or the same phase. In other words, a rising edge and a falling edge of the strobe signal DQS may be aligned with respective edge portions of the data signal DQ and provided. The data signal DQ may include a plurality of pieces of data D1 to D5, that is, a first datum D1, a second datum D2, a third datum D3, a fourth datum D4, and a fifth datum D5. The strobe signal DQS may include a plurality of clocks CLK1 to CLK3, that is, a first clock CLK1, a second lock CLK2, and a third clock CLK3. According to some example embodiments, the plurality of clocks may correspond to timing data, or timing pulses, included in the strobe signal DQS.

With reference to (b) of FIG. 4, a delay may occur in the strobe signal DQS according to a strobe buffer, or the like, so that a phase of the strobe signal DQS may be unpaired from a phase of the data signal DQ. The phase detection unit 220 may detect a phase difference (Diff_ph) by comparing a first datum D1 corresponding to a first datum of the data signal DQ with a first clock CLK1 corresponding to a first clock of the strobe signal DQS. The phase detection unit 220 may determine a compensation level Lcom of the strobe signal DQS according to the detected phase difference (Diff_ph). The phase detection unit 220 may generate a compensation signal according to the compensation level Lcom of the strobe signal DQS.

With reference to (c) of FIG. 4, according to the compensation signal provided by the phase detection unit 220, the phase adjust unit 230 may adjust the phase of the strobe signal DQS so as to align a central portion of first effective data of the data signal DQ with a rising edge of the first clock of the strobe signal DQS. The sampling unit 240 may recognize an appropriate data signal DQ in such a manner that the data signal DQ is latched using the strobe signal DQS aligned with the central portion of the data signal DQ after a phase of the strobe signal DQS is adjusted.

As described above, the phase of the strobe signal DQS may be adjusted so that the phase detection unit 220 may compare a first datum of the data signal DQ with a first clock of the strobe signal DQS, and the phase adjust unit 230 may align the central portion of the first effective data of the data signal DQ with the rising edge of the first clock of the strobe signal DQS.

In a case in which the rising edge and the falling edge of the strobe signal DQS provided by the memory controller 100a are aligned with central portions of data in the data signal DQ provided, the rising edge of the first clock of the strobe signal DQS is delayed such that the rising edge of the strobe signal DQS is aligned with a portion of the data signal DQ after the central portion of the first datum of the data signal DQ. Thus, despite a subsequent process of adjusting a phase, the data signal DQ may not be appropriately recognized by the sampling unit 240.

Figure 5:
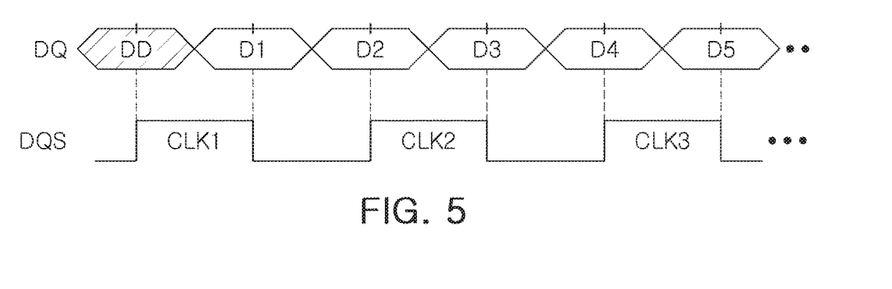
FIG. 5 is a waveform diagram of a data signal including dummy data and a strobe signal, as provided by a memory controller, according to some example embodiments.

FIG. 5 is a waveform diagram of a data signal including dummy data and a strobe signal, provided by a memory controller, according to some example embodiments.

With reference to FIG. 5, a memory controller 100a may align a rising edge and a falling edge of a strobe signal DQS to central portions of data in the data signal DQ to be provided to the memory device 200a. With reference to FIG. 5, in a manner different from the data signal DQ of (a) of FIG. 4, the data signal DQ may include dummy data DD preceding a first datum D1, a second datum D2, a third datum D3, a fourth datum D4, and a fifth datum D5. The dummy data DD may have a specification similar to or the same as those of the first datum D1, the second datum D2, the third datum D3, the fourth datum D4, and the fifth datum D5. In some example embodiments, the dummy data DD may have a period similar to or the same as each of the first datum D1, the second datum D2, the third datum D3, the fourth datum D4, and the fifth datum D5.

In FIG. 5, the data signal DQ is illustrated as having a single dummy datum DD in FIG. 5. According to some example embodiments, the dummy data DD may be provided as a plurality of pieces of dummy data. The first datum D1, the second datum D2, the third datum D3, the fourth datum D4, and the fifth datum D5 may be referred to as effective data to have a meaning different from that of the dummy data DD. In addition, in FIG. 5, the data signal DQ is illustrated as including the dummy data DD, but, in some example embodiments, the data signal DQ may include only effective data D1 to D5 without the dummy data DD. For example, the effective data D1 to D5 may be provided to be delayed for a determined time section (e.g., a duration), in which the dummy data DD is disposed in FIG. 5, as compared with a strobe signal. Hereinafter, for the sake of convenience of explanation, a case in which the data signal DQ includes the dummy data DD and the effective data D1 to D5 is taken as an example.

According to some example embodiments, the data signal DQ may include the dummy data DD preceding a plurality of pieces of data D1 to D5 in addition to the plurality of pieces of data D1 to D5, thereby enabling a corresponding sampling circuit to recognize the data signal DQ even if the rising edge and the falling edge of the strobe signal DQS are aligned with central portions of data in the data signal DQ as provided by the memory controller 100a, as discussed above in association with FIG. 4.

Figure 6:
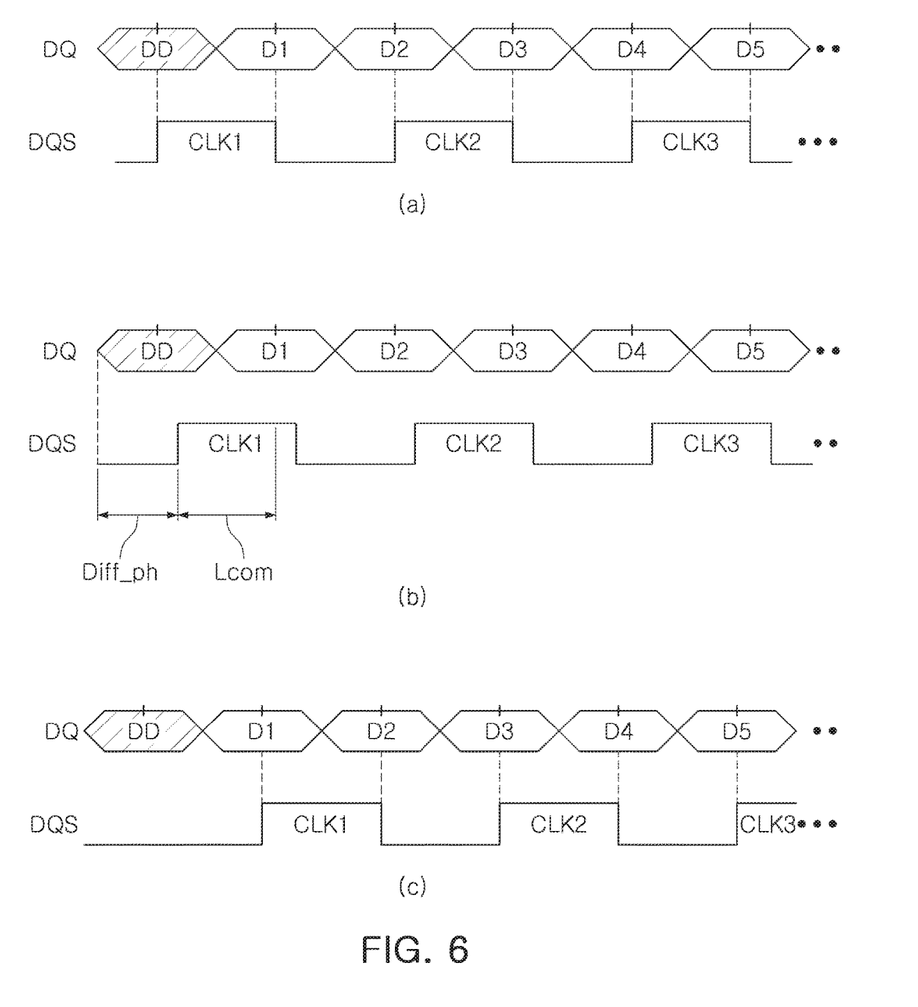
FIG. 6 is a waveform diagram illustrating a process of aligning a data signal including dummy data and a strobe signal according to some example embodiments.

FIG. 6 is a waveform diagram illustrating a process of aligning a data signal including dummy data and a strobe signal according to some example embodiments.

(a) of FIG. 6 represents a data signal DQ and a strobe signal DQS, provided by a memory controller 100a; (b) of FIG. 6 represents the data signal DQ and the strobe signal DQS, detected by a phase detection unit 220; and (c) of FIG. 6 represents the data signal DQ and the strobe signal DQS provided to a sampling unit 240.

With reference to (a) of FIG. 6, the data signal DQ and the strobe signal DQS, provided by the memory controller 100a, have a phase difference of 90°. In other words, both a rising edge and a falling edge of the strobe signal DQS may be aligned with central portions of data in the data signal DQ provided. The data signal DQ may include dummy data DD, as well as a first datum D1, a second datum D2, a third datum D3, a fourth datum D4, and a fifth datum D5, while the strobe signal DQS may include a first clock CLK1, a second clock CLK2, and a third clock CLK3.

With reference to (b) of FIG. 6, a delay may be caused by a strobe buffer 210 or the like, so that a phase of the strobe signal DQS may be unpaired from a phase of the data signal DQ. The phase detection unit 220 may compare the dummy data DD corresponding to a first datum of the data signal DQ with the first clock CLK1 corresponding to a first clock of the strobe signal DQS to detect a phase difference (Diff_ph) and may determine a compensation level Lcom of the strobe signal DQS, according to a detected phase difference (Diff_ph). The phase detection unit 220 may generate the compensation signal according to the compensation level Lcom of the strobe signal DQS.

With reference to (c) of FIG. 6, according to the compensation signal provided by the phase detection unit 220, a phase adjust unit 230 may adjust the phase of the strobe signal DQS so as to align a central portion of a first datum D1 corresponding to a first effective datum of the data signal DQ with the rising edge of the first clock of the strobe signal DQS. The sampling unit 240 may recognize an appropriate data signal DQ in such a manner that the data signal DQ is latched using the strobe signal DQS aligned with the central portions of data in the data signal DQ after a phase of the strobe signal DQS is adjusted.

In the meantime, a description provided above corresponding to FIG. 6 illustrates that the data signal DQ and the strobe signal DQS, provided by the memory controller 100a, have a phase difference of 90°. However, even in the case in which the data signal DQ and the strobe signal DQS, provided by the memory controller 100a, have a similar phase or the same phase, the phase adjustment described in association with FIG. 6 may be applied.

Figure 7:
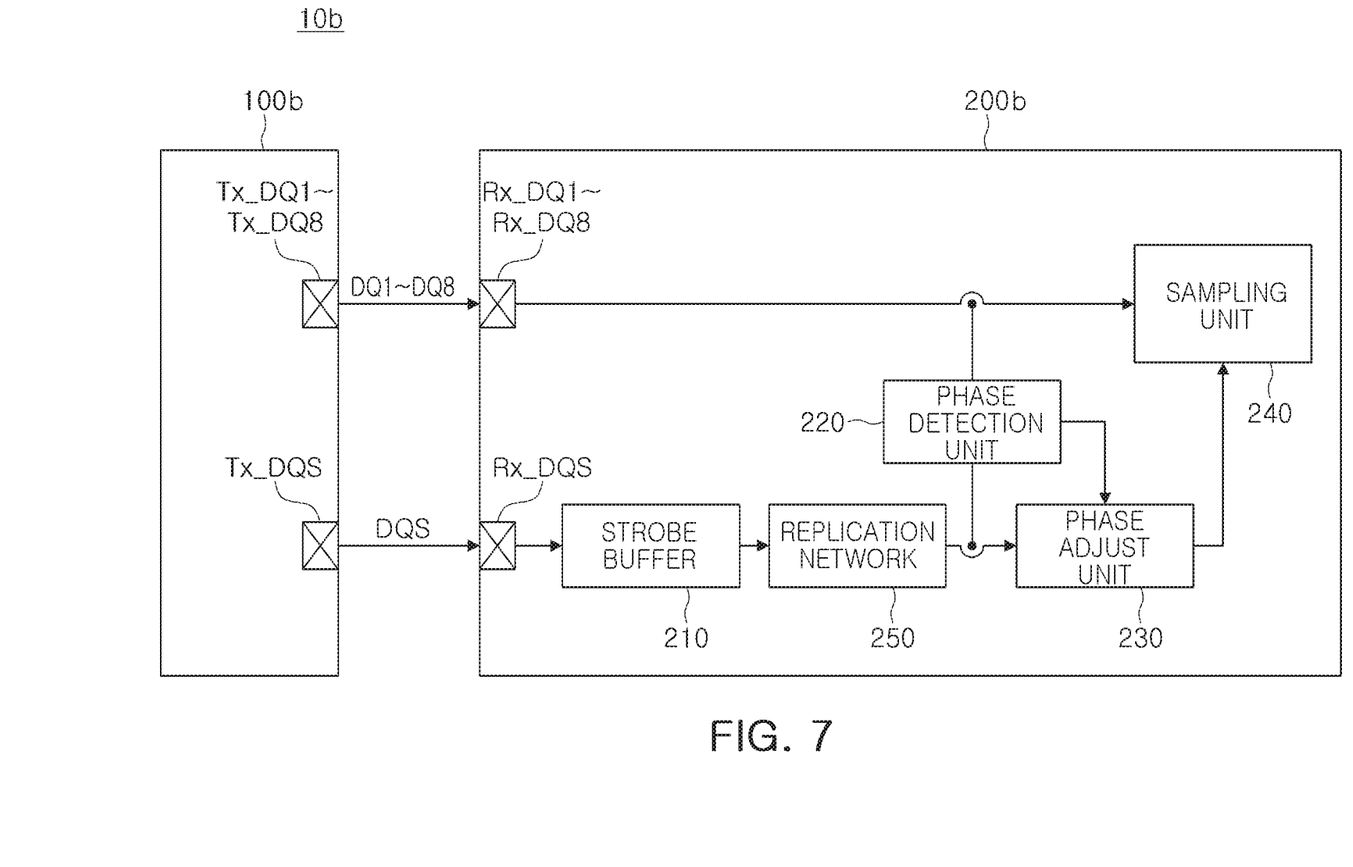
FIG. 7 is a block diagram of the memory system including a replication network according to some example embodiments.

FIG. 7 is a block diagram of a memory system including a replication network according to some example embodiments.

Since a memory system 10b of FIG. 7 is similar to a memory system 10a of FIG. 3, overlapping descriptions will be omitted, and only descriptions based on a difference will be provided.

With reference to FIG. 7, the memory system 10b may include a memory controller 100b and a memory device 200b. The memory controller 100b may output data signals DQ1 to DQ8 and a strobe signal DQS through output pins Tx_DQ1 to Tx_DQ8, and Tx_DQS. According to some example embodiments, the memory controller 100b may execute non-transitory computer-readable instructions stored in a memory to perform operations described herein as being performed by the memory controller 100b.

The memory device 200 may receive the data signals DQ1 to DQ8 and the strobe signal DQS through input pins Rx_DQ1 to Rx_DQ8, and Rx_DQS. The memory device 200 may include a strobe buffer 210, a phase detection unit 220, a phase adjust unit 230, a sampling unit 240, and a replication network 250. According to some example embodiments, operations described as being performed by the replication network 250 may be performed by circuitry. For example, the circuitry may include an application-specific integrated circuit (ASIC) or a field programmable gate array (FPGA). The strobe buffer 210, the phase detection unit 220, the phase adjust unit 230 and the sampling unit 240 may be similar to or the same as the strobe buffer 210, the phase detection unit 220, the phase adjust unit 230 and the sampling unit 240 of FIG. 3. Redundant descriptions between FIGS. 3 and 7 may be omitted.

The strobe buffer 210 may receive the strobe signal DQS from the memory controller 100b. The replication network 250 may replicate the strobe signal DQS received in the strobe buffer 210 to correspond to a number of the data signals DQ1 to DQ8.

Figure 8:
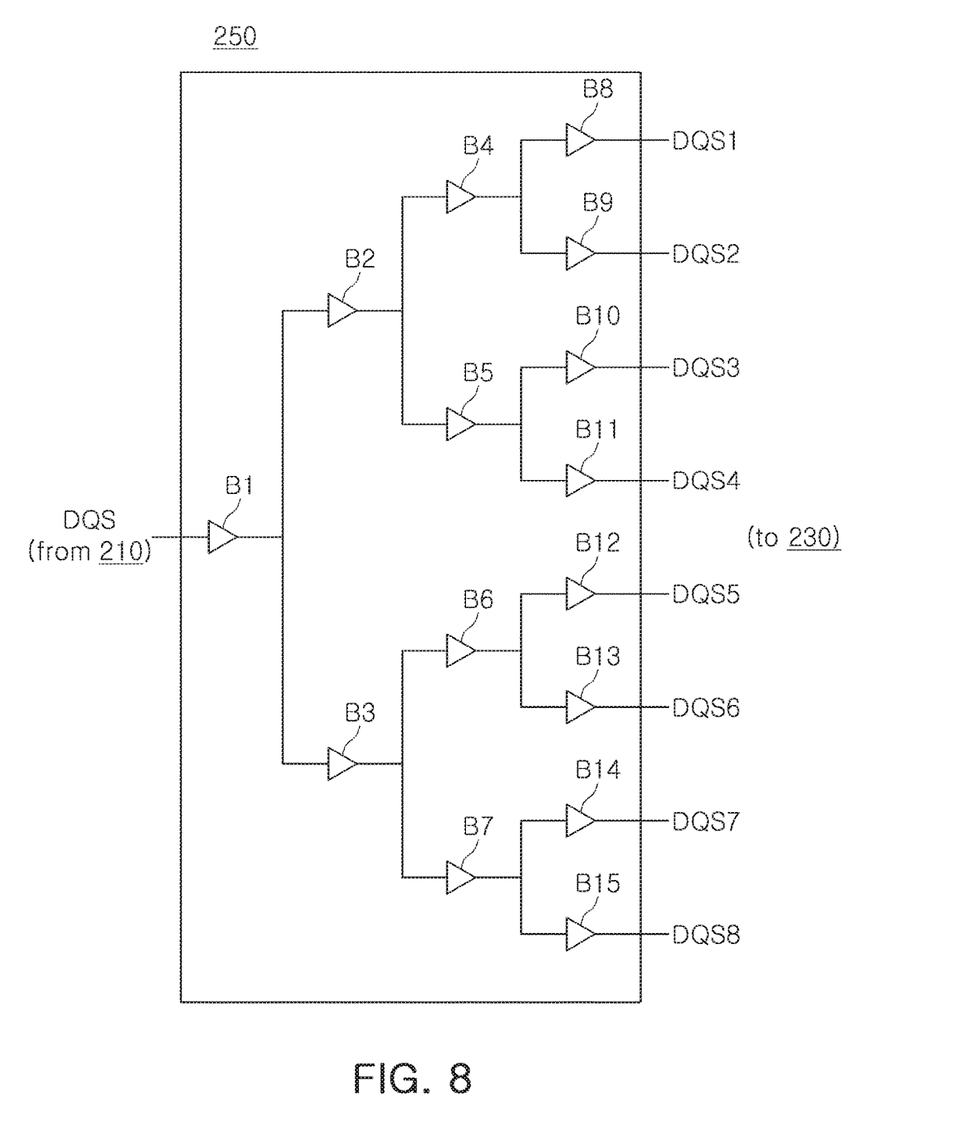
FIG. 8 is a view of a replication network according to some example embodiments.

FIG. 8 is a view of a replication network according to some example embodiments. A replication network 250 may include a plurality of buffers B1 to B15 disposed on a network path having a tree form. The plurality of buffers B1 to B15 may reduce or prevent loss of the strobe signal DQS on the network path.

With reference to FIG. 8, the replication network 250 may sequentially replicate the strobe signal DQS transmitted from a strobe buffer 210 to generate strobe signals DQS1 to DQS8 corresponding to a number of data signals DQ1 to DQ8.

With reference to FIG. 7, the sampling unit 240 may receive the strobe signals DQS1 to DQS8 transmitted from the replication network 250 through a phase adjust unit 230 and may receive the data signals DQ1 to DQ8 from the memory controller 100b. The sampling unit 240 may sample each of the data signals DQ1 to DQ8 using respective strobe signals DQS1 to DQS8. The sampling unit 240 may include a number of sampling circuits corresponding to the number of the strobe signals DQS1 to DQS8 and the data signals DQ1 to DQ8.

In order to properly latch the data signals DQ1 to DQ8 in the sampling unit 240, the strobe signals DQS1 to DQS8 are aligned with central portions of data in the respective data signals DQ1 to DQ8. However, the sampling unit 240 may directly receive the data signals DQ1 to DQ8 from the memory controller 100 and may receive the strobe signals DQS1 to DQS8 provided by the memory controller 100 through the strobe buffer 210 and the replication network 250. Thus, depending on a delay of the strobe signals DQS1 to DQS8, a phase difference between the data signals DQ1 to DQ8 and the strobe signals DQS1 to DQS8 may not be 90° without adjusting the phase of the strobe signals DQS1 to DQS8.

The phase detection unit 220 may receive the data signals DQ1 to DQ8 from the memory controller 100b and may receive the strobe signals DQS1 to DQS8 from the replication network 250. The phase detection unit 220 may detect a phase difference between the data signals DQ1 to DQ8 provided by the memory controller 100b and the respective strobe signals DQS1 to DQS8 provided by the replication network 250. According to some example embodiments, a phase difference between one of the data signals DQ1 to DQ8 and a respective one of the strobe signals DQS1 to DQS8 may be detected. The phase difference may include a delay phase difference caused by the strobe buffer 210 and the replication network 250 disposed on a path of the strobe signal DQS, and a phase difference between the data signals DQ1 to DQ8 and the strobe signal DQS as provided by the memory controller 100b.

The phase detection unit 220 may detect a phase difference between the data signals DQ1 to DQ8, provided by the memory controller 100b, and the strobe signals DQS1 to DQS8, provided by the replication network 250, to determine a compensation level of the strobe signals DQS1 to DQS8. In some example embodiments, the phase detection unit 220 may detect a phase difference by comparing a first datum of one of the data signals DQ1 to DQ8 with a first clock of a respective one of the strobe signals DQS1 to DQS8, and may determine the compensation level according to the detected phase difference. The phase detection unit 220 may generate a compensation signal according to the compensation level of the strobe signals DQS1 to DQS8, to be provided to the phase adjust unit 230.

The phase adjust unit 230 may receive the strobe signals DQS1 to DQS8 from the replication network 250 and may receive the compensation signal from the phase detection unit 220. The phase adjust unit 230 may adjust a phase of respective strobe signals DQS1 to DQS8, provided by the replication network 250, according to the compensation signal provided by the phase detection unit 220. In some example embodiments, the phase adjust unit 230 may adjust the phase of the strobe signals DQS1 to DQS8 so as to align a central portion of first effective data of each of the data signals DQ1 to DQ8 with a rising edge of a first clock of a corresponding one of the strobe signals DQS1 to DQS8. In other words, the rising edge and the falling edge of the strobe signals DQS1 to DQS8 may be aligned with the central portions of data of the respective data signals DQ1 to DQ8 by the phase adjust unit 230. The phase adjust unit 230 may provide the strobe signals DQS1 to DQS8, a phase of which has been adjusted, to the sampling unit 240.

The sampling unit 240 may receive the data signals DQ1 to DQ8 from the memory controller 100 and receive the strobe signals DQS1 to DQS8, a phase of which has been adjusted, from the phase adjust unit 230. The sampling unit 240 may recognize appropriate data signals DQ1 to DQ8 in such a manner that the data signals DQ1 to DQ8 are latched using the strobe signals DQS1 to DQS8 respectively aligned with the central portions of data in the data signals DQ1 to DQ8 after a phase of the strobe signals DQS1 to DQS8 is adjusted.

In a manner different from that described in association with FIG. 3, in some example embodiments, a degree of delay of the strobe signals DQS1 to DQS8 may be further increased according to lines connecting the plurality of buffers B1 to B15 on the replication network 250.

Similar to the discussion above in association with (a) of FIG. 4, even in the case in which the data signals DQ1 to DQ8 and the strobe signal DQS are aligned to have a similar phase or the same phase as provided by the memory controller 100b, the rising edge of the first clock of respective strobe signals DQS1 to DQS8 may be delayed such that the rising edge of the first clock of each of the strobe signals DQS1 to DQS8 aligns with a portion after the central portion of the first datum of respective data signals DQ1 to DQ8. Thus, despite a subsequent process of adjusting a phase, the data signals DQ1 to DQ8 may not be appropriately recognized by the sampling circuit 330.

Figure 9:
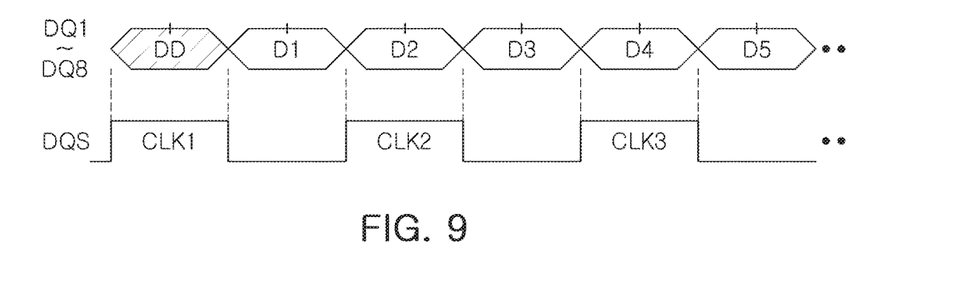
FIG. 9 is a waveform diagram of data signals and a strobe signal, provided by the memory controller, according to some example embodiments.

FIG. 9 is a waveform diagram of data signals DQ1 to DQ8 and a strobe signal DQS, provided by a memory controller, according to some example embodiments.

With reference to FIG. 9, the memory controller 100b may align edge portions of data in data signals DQ1 to DQ8 with a rising edge and a falling edge of a strobe signal DQS, to be provided to a memory device 200b. With reference to FIG. 9, in a manner different from the data signal DQ of (a) of FIG. 4, the data signals DQ1 to DQ8 may include dummy data DD and a plurality of pieces of data D1 to D5, that is, dummy data DD preceding a first datum D1, a second datum D2, a third datum D3, a fourth datum D4, and a fifth datum D5.

According to some example embodiments, each of the data signals DQ1 to DQ8 may include the dummy data DD preceding the plurality of pieces of data D1 to D5, thereby enabling a corresponding sampling circuit to recognize the data signals DQ1 to DQ8 even if the rising edge and the falling edge of the strobe signal DQS are aligned with central portions of data in each of the data signals DQ1 to DQ8 as provided by the memory controller 100b, as discussed above in association with FIG. 8.

Figure 10:
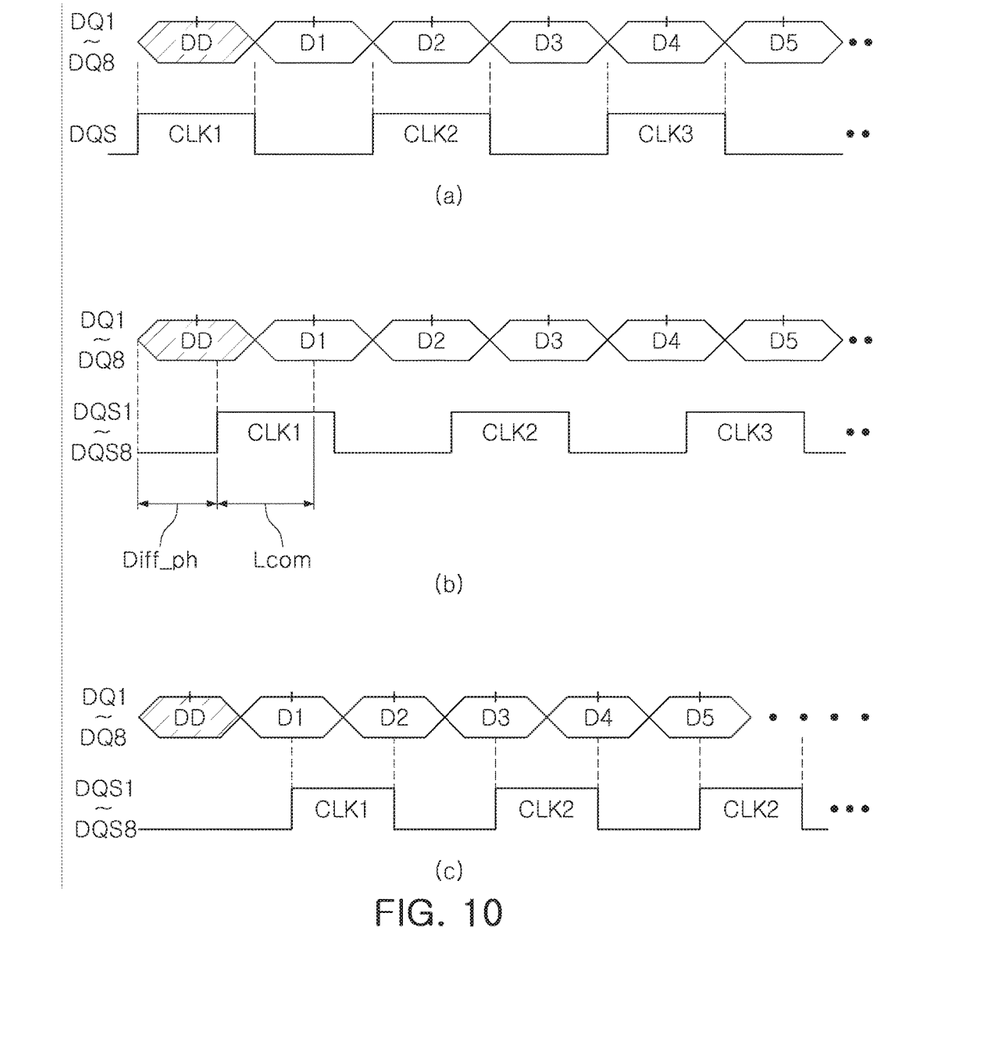
FIG. 10 is a waveform diagram illustrating a process of aligning the data signals and strobe signals according to some example embodiments.

FIG. 10 is a waveform diagram of data signals and a strobe signal(s) in a main portion according to some example embodiments.

(a) of FIG. 10 illustrates data signals DQ1 to DQ8 and a strobe signal DQS, provided by a memory controller 100b; (b) of FIG. 10 illustrates the data signals DQ1 to DQ8 and the strobe signals DQS1 to DQS8 detected by a phase detection unit 220; and (c) of FIG. 10 illustrates the data signals DQ1 to DQ8 and the strobe signals DQS1 to DQS8 provided to a sampling unit 240.

With reference to (a) of FIG. 10, the data signals DQ1 to DQ8 and the strobe signal DQS, provided by the memory controller 100b, may aligned to have a similar phase or the same phase. In other words, a rising edge and a falling edge of the strobe signal DQS may be aligned with edge portions of data in each of the data signals DQ1 to DQ8 as provided. The data signals DQ1 to DQ8 may include dummy data DD and a plurality of pieces of data D1 to D5, that is, a first datum D1, a second datum D2, a third datum D3, a fourth datum D4, and a fifth datum D5. The strobe signal DQS may include a plurality of clocks CLK1 to CLK3, that is, a first clock CLK1, a second lock CLK2, and a third clock CLK3. According to some example embodiments, the plurality of clocks may correspond to timing data included in the strobe signal DQS.

With reference to (b) of FIG. 10, a delay may be caused by a strobe buffer 210, a replication network 250, or the like, so that a phase of the strobe signals DQS1 to DQS8 may be unpaired from a phase of the data signals DQ1 to DQ8. The phase detection unit 220 may detect a phase difference (Diff_ph) by comparing the dummy data DD corresponding to a first datum of each of the data signals DQ1 to DQ8 with a first clock CLK1 of respective strobe signals DQS1 to DQS8. The phase detection unit 220 and may determine a compensation level Lcom of the strobe signals DQS1 to DQS8 according to the detected phase difference (Diff_ph). The phase detection unit 220 may generate a compensation signal according the compensation level Lcom of the strobe signals DQS1 to DQS8.

With reference to (c) of FIG. 10, according to the compensation signal provided by the phase detection unit 220, a phase adjust unit 230 may adjust a phase of the strobe signals DQS1 to DQS8 so as to align a central portion of a first datum D1 corresponding to first effective data of each of the data signals DQ1 to DQ8 with a rising edge of the first clock CLK1 of a respective one of the strobe signals DQS1 to DQS8. The sampling unit 240 may recognize appropriate data signals DQ1 to DQ8 in such a manner that each of the data signals DQ1 to DQ8 are latched using the respective strobe signals DQS1 to DQS8 aligned with central portion of data in each of the data signals DQ1 to DQ8 after a phase of the strobe signals DQS1 to DQS8 is adjusted.

The description provided above corresponding to FIG. 10 illustrates that the data signals DQ1 to DQ8 and the strobe signals DQS1 to DQS8, provided by the memory controller 100*b*, have a similar phase or the same phase. However, even in the case in which the data signals DQ1 to DQ8 and the strobe signals DQS1 to DQS8, provided by the memory controller 100*b*, have a phase difference of 90°, the phase adjustment described in association with FIG. 10 may be applied.

Figure 11:
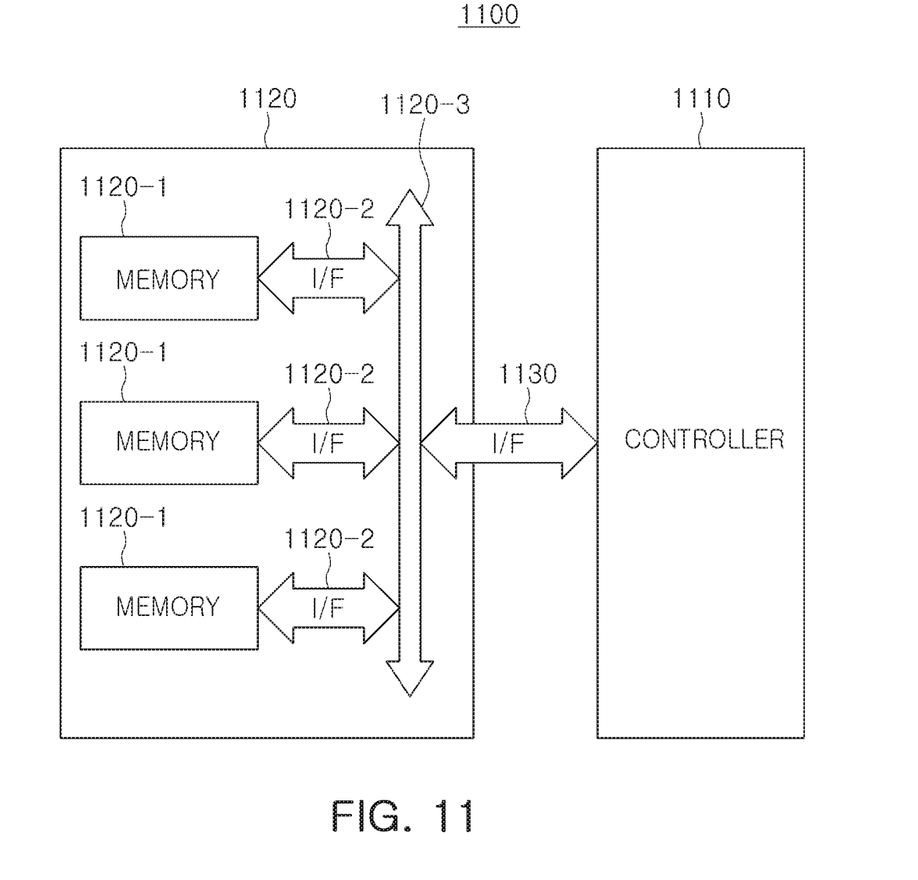
FIG. 11 is a view of an example in which the memory system is applied to a graphics memory system, according to some example embodiments.

FIG. 11 is a view of an example in which the memory system is applied to a graphics memory system according to some example embodiments.

With reference to FIG. 11, a graphics memory system may comprise a memory group 1120 including a plurality of memories 1120_1, an internal interface 1120_3, and a plurality of memory interfaces 1120_2, a controller (1110, e.g., a central processing unit (CPU)) to control the memory group 1120; and a system bus 1130 between the memory group 1120 and a controller 1110. The controller 1110 may include a graphics engine core and be configured to transmit and receive data to and from the memory group 1120. The system bus 1130, the plurality of memory interfaces 1120_2, and the internal interface 1120_3, described above, may be integrated to be implemented as a single input/output (I/O) device or may be separated. Depending on a configuration of the graphics memory system according to an application, a data format used for communication between the controller 1110 and the memory group 1120 may be partially changed through a serializer/deserializer (SERDES), or the like. According to some example embodiments, the controller 1110 may execute non-transitory computer-readable instructions stored in a memory to perform operations described herein as being performed by the controller 1110.

As set forth above, according to some example embodiments, a data signal and a strobe signal may be precisely aligned, thereby improving the reliability of operations performed by a memory device.

In the drawings, for example, due to manufacturing techniques and/or tolerances, modifications of the shape shown may be estimated. Thus, some example embodiments should not be construed as being limited to the particular shapes of regions shown herein, for example, to include a change in shape results in manufacturing.

While some example embodiments have been shown and described above, it will be apparent to those skilled in the art that modifications and variations could be made without departing from the scope of the appended claims.

What is claimed is:

1. A memory device comprising:
    an interface configured to receive a data signal and a strobe signal from an external device, the strobe signal corresponding to the data signal;
    a strobe buffer configured to receive the strobe signal from the interface;
    a phase detection unit configured to detect a phase difference between the data signal output from the interface and the strobe signal output from the strobe buffer;
    a phase adjust unit configured to adjust a phase of the strobe signal output from the strobe buffer based on the phase difference; and
    a sampling unit configured to sample the data signal output from the interface based on the strobe signal output from the phase adjust unit.

2. The memory device of claim 1, wherein the data signal and the strobe signal have the same phase, as provided by the external device.

3. The memory device of claim 2, wherein the phase difference corresponds to a delay phase difference caused by the strobe buffer.

4. The memory device of claim 2, wherein the phase detection unit is configured to determine a compensation level of the strobe signal according to the phase difference.

5. The memory device of claim 4, wherein the phase adjust unit is configured to adjust the phase of the strobe signal by delaying the strobe signal according to the compensation level.

6. The memory device of claim 5, wherein the phase adjust unit includes a delay locked loop circuit configured to delay the strobe signal.

7. The memory device of claim 3, wherein the phase adjust unit is configured to adjust the phase of the strobe signal to compensate for the delay phase difference.

8. A memory system, comprising:
    a memory controller configured to output
        a data signal including a plurality of pieces of data, the plurality of pieces of data including at least one piece of dummy data preceding a plurality of pieces of effective data, and
        a strobe signal including a plurality of timing pulses; and
    a memory device including
        a strobe buffer configured to receive the strobe signal,
        a phase detection unit configured to detect a phase difference between the data signal and the strobe signal output from the strobe buffer based on the at least one piece of dummy data and the strobe signal,
        a phase adjust unit configured to adjust a phase of the strobe signal output from the strobe buffer according to the phase difference, and
        a sampling unit configured to sample the data signal according to the strobe signal output from the phase adjust unit.

9. The memory system of claim 8, wherein a rising edge and a falling edge of a timing pulse of the plurality of timing pulses are aligned with one of
    central portions of two pieces of data of the plurality of pieces of data, and
    edges of one or more pieces of data of the plurality of pieces of data, as output by the memory controller.

10. The memory system of claim 9, wherein the phase difference includes at least one of
    an initial phase difference between the data signal and the strobe signal as provided by the memory controller, and
    a delay phase difference caused by the strobe buffer.

11. The memory system of claim 8, wherein the data signal includes a plurality of pieces of dummy data.

12. The memory system of claim 8, wherein the phase detection unit is configured to detect the phase difference based on the at least one piece of dummy data and a first timing pulse among the plurality of timing pulses.

13. The memory system of claim 12, wherein the phase adjust unit is configured to adjust the phase of the strobe signal by aligning a rising edge and a falling edge of one or more of the plurality of timing pulses with respective central portions of the plurality of pieces of effective data.

14. The memory system of claim 10, wherein the phase adjust unit is configured to adjust the phase of the strobe signal to compensate for the at least one of the initial phase difference and the delay phase difference.

15. A memory system, comprising:
a memory controller configured to output a plurality of data signals and a strobe signal corresponding to the plurality of data signals, each of the plurality of data signals including effective data, the effective data being delayed for a determined duration with respect to the strobe signal; and
a memory device configured to
receive the strobe signal via a strobe buffer,
replicate the strobe signal to generate a plurality of strobe signals, a quantity of strobe signals in the plurality of strobe signals corresponding to a quantity of data signals in the plurality of data signals,
adjust a phase of each of the plurality of strobe signals based on the plurality of data signals and the plurality of strobe signals, and
sample the plurality of data signals according to respective strobe signals of the plurality of strobe signals.

16. The memory system of claim 15, wherein each of the plurality of data signals includes at least one piece of dummy data preceding the effective data, the at least one piece of dummy data being in the determined duration.

17. The memory system of claim 16, wherein the effective data includes a plurality of pieces of effective data, the at least one piece of dummy data having the same period as each of the plurality of pieces of effective data.

18. The memory system of claim 15, wherein the memory device includes a replication network configured to replicate the strobe signal received via the strobe buffer to generate the plurality of strobe signals.

19. The memory system of claim 18, wherein the replication network includes a plurality of buffers.

20. The memory system of claim 19, wherein the memory device is configured to adjust the phase of each of the plurality of strobe signals to compensate for at least one of
an initial phase difference between the plurality of data signals and the strobe signal as provided by the memory controller, and
a delay phase difference generated by the strobe buffer and the plurality of buffers of the replication network.

* * * * *